ится
United States Patent
Miyashita et al.

(10) Patent No.: US 11,488,847 B2
(45) Date of Patent: Nov. 1, 2022

(54) APPARATUS AND METHOD FOR HEAT-TREATING SUBSTRATE

(71) Applicant: TOKYO ELECTRON LIMITED, Tokyo (JP)

(72) Inventors: Hiroyuki Miyashita, Nirasaki (JP); Shohei Yoshida, Nirasaki (JP); Takahisa Mase, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 202 days.

(21) Appl. No.: 16/919,464

(22) Filed: Jul. 2, 2020

(65) Prior Publication Data

US 2021/0020477 A1 Jan. 21, 2021

(30) Foreign Application Priority Data

Jul. 16, 2019 (JP) .............................. JP2019-131272

(51) Int. Cl.
| | | |
|---|---|---|
| *H01L 21/67* | (2006.01) | |
| *F27B 17/00* | (2006.01) | |
| *H01L 21/66* | (2006.01) | |
| *H01L 21/324* | (2006.01) | |

(52) U.S. Cl.
CPC .... *H01L 21/67248* (2013.01); *F27B 17/0025* (2013.01); *H01L 21/324* (2013.01); *H01L 21/67103* (2013.01); *H01L 22/26* (2013.01)

(58) Field of Classification Search
CPC ............. H01L 21/67248; H01L 21/324; H01L 21/67103; H01L 22/26; H01L 21/67115; H01L 21/67242; F27B 17/0025; G01J 5/007
See application file for complete search history.

(56) References Cited

U.S. PATENT DOCUMENTS

| | | | |
|---|---|---|---|
| 7,258,892 B2 * | 8/2007 | Beaman .................. | C23C 16/00 219/490 |
| 2019/0185989 A1 * | 6/2019 | McFadden ............ | C23C 14/541 |
| 2022/0078888 A1 * | 3/2022 | Mase ..................... | G05D 23/22 |

FOREIGN PATENT DOCUMENTS

JP 2006-313779 A 11/2006

* cited by examiner

*Primary Examiner* — Jarrett J Stark

(74) *Attorney, Agent, or Firm* — Nath, Goldberg & Meyer; Jerald L. Meyer; Tanya E. Harkins

(57) ABSTRACT

An apparatus for heat-treating a substrate includes: a stage where the substrate is disposed; a heating part configured to change an output; a first temperature measurement part configured to measure a temperature at which the substrate is heated; a second temperature measurement part configured to measure the temperature, and having a level of measurement accuracy which is lower than that of the first temperature measurement part in a first temperature region and is higher than that of the first temperature measurement part in a second temperature region; a temperature calculator configured to calculate a weighted average temperature of the temperatures measured by the first and second temperature measurement parts if a reference temperature is in a temperature range between the first and second temperatures, and configured to change a weight of the weighted average temperature; and a controller configured to control the output based on the weighted average temperature.

20 Claims, 13 Drawing Sheets

APPARATUS AND METHOD FOR HEAT-TREATING SUBSTRATE

CROSS-REFERENCE TO RELATED APPLICATION

This application is based upon and claims the benefit of priority from Japanese Patent Application No. 2019-131272, filed on Jul. 16, 2019, the entire contents of which are incorporated herein by reference.

TECHNICAL FIELD

The present disclosure relates to an apparatus and a method for heat-treating a substrate.

BACKGROUND

In manufacturing a semiconductor device, a film formation for forming a film on a substrate, a modification of the film formed on the substrate, and the like are performed as a heat treatment of the substrate. For example, the heat treatment is performed by disposing the substrate on a stage and heating the substrate by a heater. The control of a heating temperature is performed by controlling an output of the heater based, for example, on a temperature measurement value measured by a temperature measurement part.

Patent Document 1 below discloses a technology for monitoring the temperature of a wafer by a thermocouple in a room-temperature to low-temperature range in a heat treatment apparatus, and monitoring the temperature of the wafer by a radiation thermometer in a high-temperature range, thereby controlling the heating output.

PRIOR ART DOCUMENT

Patent Document

Japanese Laid-Open Patent Publication No. 2006-313779

SUMMARY

According to one embodiment of the present disclosure, there is provided an apparatus for heat-treating a substrate, the apparatus including: a stage on which the substrate is disposed; a heating part configured to change an output for heating the substrate disposed on the substrate; a first temperature measurement part configured to measure a temperature at which the substrate is heated by the heating part, a second temperature measurement part configured to measure the temperature at which the substrate is heated by the heating part, and having a level of measurement accuracy that is lower than a level of measurement accuracy of the first temperature measurement part in a first temperature region lower than a first temperature and is higher than the level of measurement accuracy of the first temperature measurement part in a second temperature region higher than a second temperature which is higher than the first temperature; a temperature calculator configured to calculate a weighted average temperature of the temperature measured by the first temperature measurement part and the temperature measured by the second temperature measurement part if a reference temperature, which is one of a temperature measured by the first temperature measurement part and a temperature measured by the second temperature measurement part, is in a temperature range between the first temperature and the second temperature, and configured to change a weight of the weighted average temperature such that, a ratio of the temperature measured by the first temperature measurement part becomes larger as the reference temperature becomes closer to the first temperature, and a ratio of the temperature measured by the second temperature measurement part becomes larger as the reference temperature becomes closer to the second temperature; and a controller configured to control the output of the heating part based on the weighted average temperature calculated by the temperature calculator in the temperature range between the first temperature and the second temperature.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An apparatus for heat-treating a substrate according to a first embodiment of the present disclosure will be described with reference to FIGS. 1 to 4. The apparatus for heat-treating the substrate in this example is a heat treatment apparatus 1 configured to perform heat treatment on a semiconductor wafer (hereinafter, referred to as "wafer") W, which is a substrate.

Figure 1:
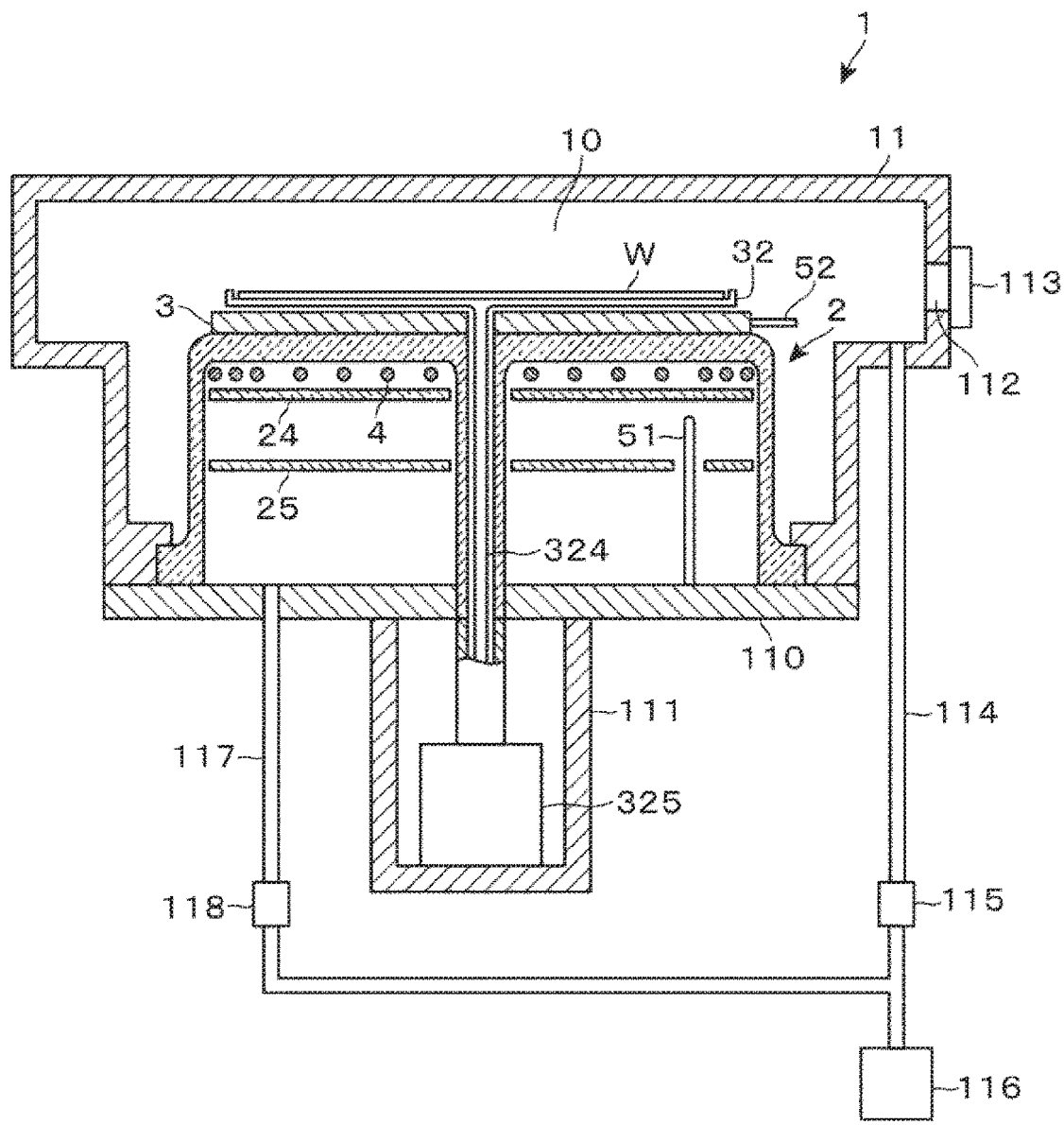
FIG. 1 is a longitudinal cross-sectional side view illustrating a heat treatment apparatus according to an embodiment of the present disclosure.
Figure 2:
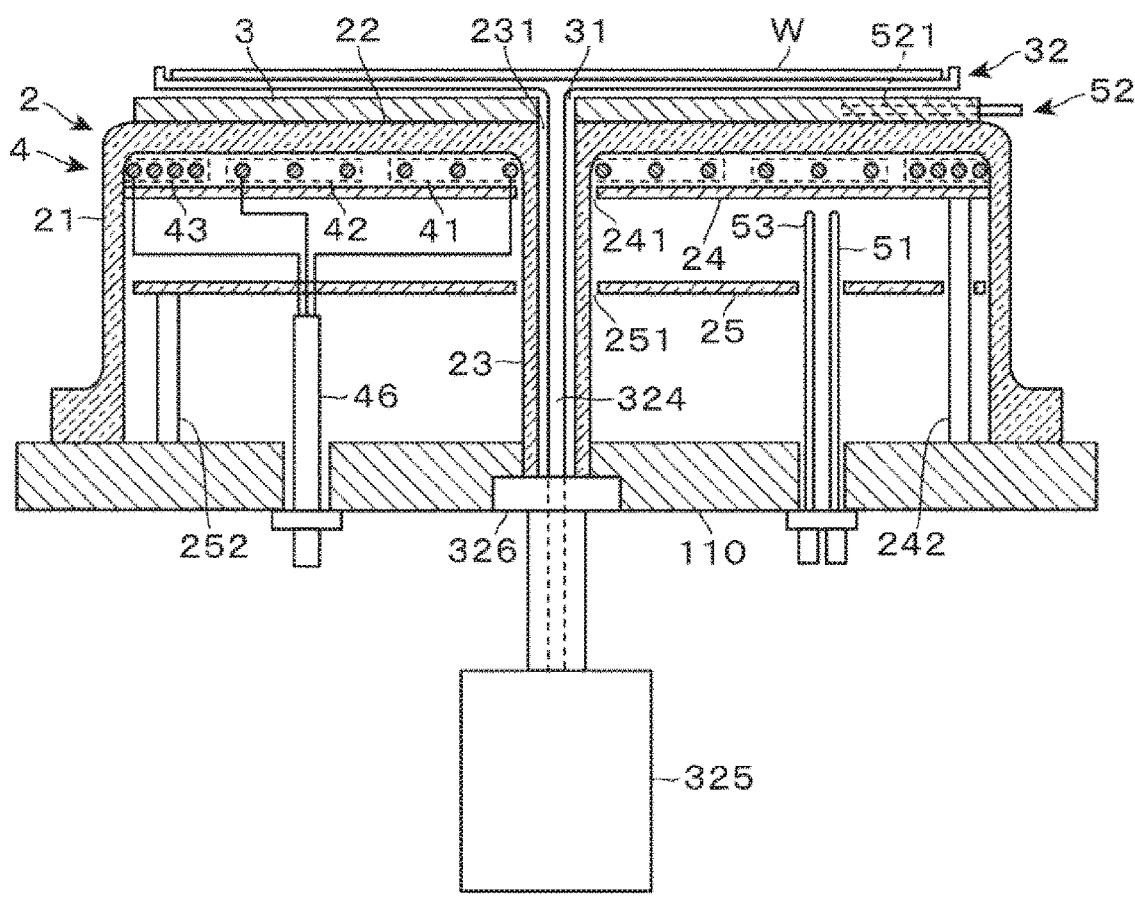
FIG. 2 is a longitudinal cross-sectional side view illustrating an example of configuration of major parts of the heat treatment apparatus.

As illustrated in FIGS. 1 and 2, the heat treatment apparatus 1 includes a process chamber 11 configured to be hermetically sealed, and a bell jar 2 made of transparent quartz, for example, is installed inside the process chamber 11.

As illustrated in FIG. 2, the bell jar 2 includes, for example, a cylinder member 21, a top plate 22 covering the upper side of the cylinder member 21, and a hollow member 23 extending downwards from the center of the top plate 22. The top plate 22 is supported by the cylinder member 21 so as to face a bottom wall 110 of the process chamber 11, and a lower end of the cylinder member 21, for example, may be attached to the bottom wall 110. In this example, an interior of the process chamber 1 is partitioned by the bell jar 2, a stage 3 on which the wafer W is disposed is installed above the bell jar 2, and a heating part (described later) is installed inside the bell jar 2.

Figure 3:
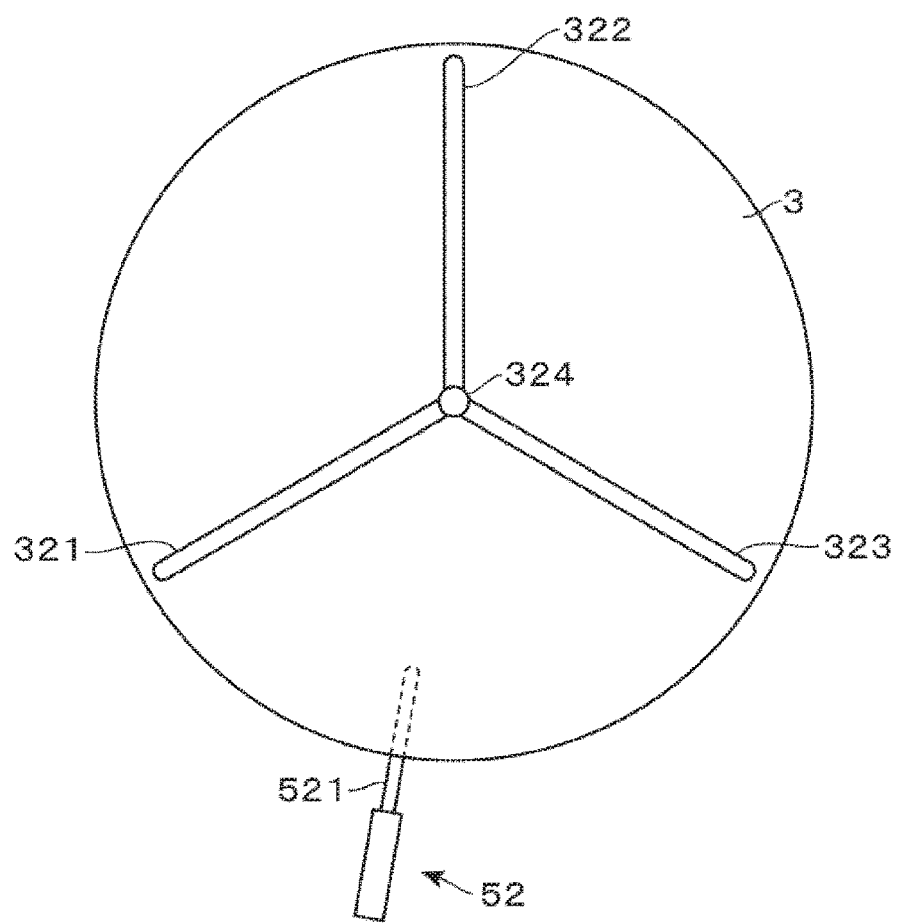
FIG. 3 is a plan view illustrating a part of the heat treatment apparatus.

As illustrated in FIGS. 1 to 3, the stage 3 is made of such as aluminum nitride (AlN), is formed in a disk-shape larger than the wafer W when viewed in a plan view, and is loaded on the top plate 22 of the bell jar 2. An opening 31 is formed approximately at the center of the stage 3 and is positioned to correspond to an opening 231 of the hollow member 23 of the bell jar 2 when viewed in a plan view.

In this example, the wafer W is supported above the stage 3 by a support member 32 so as to face the surface of the stage 3. As illustrated in FIG. 3, the support member 32 includes, for example, three support arms 321, 322, and 323 supporting the wafer W and a rotating shaft 324 to which the support arms 321 to 323 are coupled. The support arms 321 to 323 may be configured so as to extend radially in the horizontal direction at an interval of 120 degrees around a center axis defined by the upper end of the rotating shaft 324 in a state in which the support arms 321 to 323 are slightly levitated from the stage 3. For example, a protrusion (not illustrated) is formed in an intermediate position in the longitudinal direction of each of the support arms 321 to 323, and the wafer W is supported at three points in which the protrusions of respective support arms 321 to 323 come in contact with. The support member 32 is made of, for example, transparent quartz so as not to block heat from the stage 3.

The rotating shaft 324 of the support member 32 is made of, for example, opaque quartz, and is installed so as to be inserted into the hollow member 23 of the bell jar 2 through the opening 31 of the stage 3 and to extend downwards. The lower end of the rotating shaft 324 penetrates the bottom wall 110 of the process chamber 11 and is connected to a driving mechanism 325 installed in a casing 111 below the bottom wall 110. In FIG. 2, reference numeral 326 refers to a bearing. As such, the support member 32 is configured to move upwards/downwards and to rotate around a vertical axis by means of the driving mechanism 325, and the wafer W is disposed at a position slightly above the upper surface of the stage 3 by the support member 32, and is rotatably supported.

The heating part is configured, for example, by a carbon wire heater (hereinafter, referred to as "heater") 4 having a shape of an elongated tube. A disk-shaped first heat-reflecting member 24 is installed inside the bell jar 2 to face the top plate 22, and the heater 4 is disposed on a plane above the first heat-reflecting member 24 in a shape of a circular ring or a circular arc. The heater 4 includes, for example, a first heater 41 disposed at the center thereof when viewed in a plan view, a second heater 42 formed to surround an outer periphery of the first heater 41, and a third heater 43 formed to surround an outer periphery of the second heater 42. Reference numeral 46 in FIG. 2 refers to a connection member for electrically connecting each terminal of the heater 4 and a power supply cable connection terminal (not illustrated).

A disk-shaped second heat-reflecting member 25 is installed below the first heat-reflecting member 24 to face the first heat-reflecting member 24. The first heat-reflecting member 24 and the second heat-reflecting member 25 are made of, for example, opaque quartz and have openings 241 and 251, respectively, penetrated by the hollow member 23. In FIG. 2, reference numerals 242 and 252 refer to support members of the first heat-reflecting member 24 and the second heat-reflecting member 25, respectively.

The first to third heaters 41 to 43 are disposed above the first heat-reflecting member 24. The heat from the respective heaters 41 to 43 is radiated to the stage 3, and the heat reflected by the first and second heat-reflecting members 24 and 25 is also radiated to the stage 3. In this manner, the stage 3 is heated by the first to third heaters 41 to 43, and the wafer W disposed above the stage 3 is heated accordingly via the stage 3.

Figure 4:
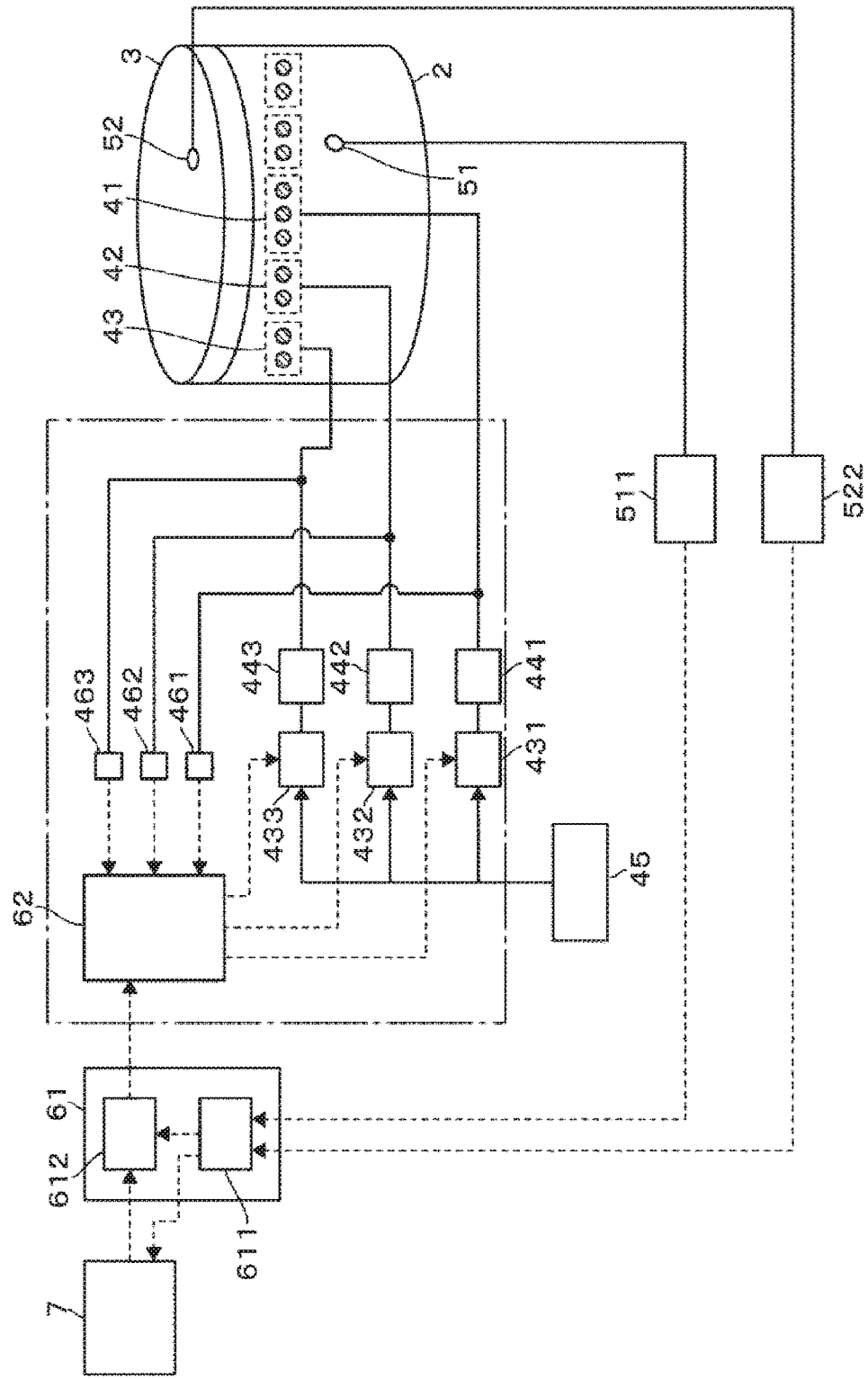
FIG. 4 is a block diagram illustrating a configuration example of a control system of the heat treatment apparatus.

As illustrated in FIG. 4, respective terminals of the first heater 41, the second heater 42, and the third heater 43 are connected to a power supply part (AC power supply) 45 via thyristors 431, 432, and 433 and current transformers 441, 442, and 443, respectively.

The thyristors 431 to 433 control power supplied to the respective heaters 41 to 43, for example, by performing a phase control of AC power supplied from the AC power supply 45. The supplied power may be controlled by changing the ratio of turn-on time for each cycle of the AC power by the thyristors 431 to 433. The current value of thyristor output is monitored by the current transformers 441 to 443. In this manner, the heater 4, which is the heating part, is configured to change an output for heating the wafer W disposed on the stage 3.

The heat treatment apparatus 1 includes a first temperature measurement part and a second temperature measurement part. Each of the first temperature measurement part and the second temperature measurement part is configured to measure a temperature at which the wafer W is heated by the heating part (heater 4). The first temperature measurement part and the second temperature measurement part in this example have different temperature measurement schemes. For example, the first temperature measurement part is configured to measure the temperature by using a thermocouple (TC) 51. In addition, the second temperature measurement part is configured to have a level of measurement accuracy lower than that of the first temperature measurement part in a temperature range lower than a first temperature, and to have a level of measurement accuracy higher than that of the first temperature measurement part in a temperature range higher than a second temperature which is higher than the first temperature. The second temperature measurement part in this example is configured to measure the temperature based on the result of sensing heat radiation, and may employ a pyrometer 52.

The description that the level of measurement accuracy is low means that, when comparing temperatures measured by the first and second temperature measurement parts, a difference (deviation) between the actual temperature (real temperature) and the temperature measured by one temperature measurement part is larger than a difference between the actual temperature and the temperature measured by the other temperature measurement part. The first and second temperatures are specified according to the characteristics of the temperature measurement parts, the position of disposition related to the heat treatment apparatus, the type of heat treatment, and the like. In this example, the thermocouple 51 has a higher level of measurement accuracy than that of the pyrometer 52 in a temperature range from room temperature to about 300 degrees C. In addition, the pyrometer 52 has a higher level of measurement accuracy than that of the thermocouple 51 in a temperature range, for example, starting from 350 degrees C. Accordingly, in this example, the first temperature is 300 degrees C., and the second temperature is 350 degrees C.

In addition, in this example, the thermocouple 51 and the pyrometer 52 are disposed in different positions. The thermocouple 51 is installed outside the stage 3, and the pyrometer 52 is installed inside the stage 3. Specifically, the thermocouple 51 is installed inside the bell jar 2 and positioned near a lower surface of the first heat-reflecting member 24. Although two thermocouples 51 and 53 are illustrated in FIG. 2, the thermocouple 53 is for an interlock purpose, and the thermocouple 51 corresponds to the first temperature measurement part.

As illustrated in FIGS. 2 and 3, the pyrometer 52 has a detector 521 inserted horizontally towards the center of the stage 3 from a side wall of the stage 3. In this example, the detector 521 has a front end installed such that, when a wafer W is disposed on the stage 3, the front end is positioned below the wafer W. The detector 521 may be contained in a recess formed to extend from the side wall of the stage 3 to an interior of the stage 3. In the following descriptions, the detector 521 will also be referred to as the pyrometer 52 in some cases.

Returning to the description of the process chamber 11, as illustrated in FIG. 1, a loading/unloading port 112 for loading/unloading the wafer W from/to the outside is formed in a side wall of the process chamber 11 and is opened/closed by agate valve 113. In addition, the process chamber 11 is connected to an evacuation part 116 configured by a vacuum pump or the like by an exhaust pipe 114, via a pressure adjustment part 115 configured to control an internal pressure of the process chamber 11. In addition, the evacuation part 116 is connected to an inner space of the bell jar 2 by an exhaust pipe 117 having a pressure adjustment part 118. In this manner, when the process space 10 of the process chamber 11 is depressurized by the evacuation part 116, the inner space of the bell jar 2 is also depressurized so as to decrease the pressure difference between the inner space of the bell jar 2 and the process space 10.

Next, the control system of the heating part will be described with reference to FIG. 4. Electromotive force output from the thermocouple 51 is output to a temperature calculator 611 of a heating controller 61 via a converter 511. The converter 511 has a function of converting the electromotive force from the thermocouple 51 into temperature data. In addition, a detection value from the pyrometer 52 is output to the temperature calculator 611 of the heating controller 61 via a main body 522. The main body 522 has a function of converting the detection value from the pyrometer 52 into temperature data.

The heating controller 61 is configured by a microcomputer, and includes the above-described temperature calculator 611 and an output setting part 612. The temperature calculator 611 calculates a weighted average temperature (described later) based on measured temperatures obtained from the thermocouple 51 and the pyrometer 52. The temperature calculator 611 is configured to switch the temperature that is output to the output setting part 612 between the measured temperature from the thermocouple 51 or the pyrometer 52 and the above-mentioned weighted average temperature. The output setting part 612 is configured to set power to be supplied to the first to third heaters 41 to 43 (total supplied power value) based on the measured temperatures from the thermocouple 51 and the pyrometer 52 or the calculated weighted average temperature. The heating controller 61 including the output setting part 612 corresponds to a controller according to the present disclosure, which controls the output of the heating part based on the weighted average temperature calculated by the temperature calculator 611.

In a temperature range in which a temperature measured by the thermocouple 51 or the pyrometer 52 is used, the output setting part 612 compares the measured temperature with a predetermined (preset) setting temperature and sets the value of power supplied to each heater 41 to 43 such that the measured temperature approaches the setting temperature. In a temperature range in which the weighted average temperature is used, the output setting part 612 conducts a comparison similar to the case of the measured temperature and sets the value of power supplied to each heater 41 to 43 such that the calculated weighted average temperature approaches the setting temperature. As will be described later, output ratios of the first to third heaters 41 to 43 are preset in a main controller 7, and the value of power supplied to each heater 41 to 43 is set by multiplying the total supplied power value, for example, by the output ratio of each of the first to third heaters 41 to 43.

The output controller 62 is configured by a microcomputer and is configured to control operations of respective thyristors 431 to 433 based on the values of power supplied to the first to third heaters 41 to 43 set by the output setting part 612. The thyristors 431 to 433 are controlled such that values of power detected at outlets of respective current transformers 441 to 443 approach the values of power supplied to the respective heaters 41 to 43. As a result, based on temperatures obtained using the thermocouple 51 and the pyrometer 52 (respective measured temperatures or weighted average temperature), the power supplied from the power supply part 45 to the respective heaters 41 to 43 via the respective thyristors 431 to 433 and the respective current transformers 441 to 443 is controlled. For example, the first to third heaters 41 to 43 are installed with wattmeters 461, 462, and 463, respectively, and the wattmeters 461 to 463 respectively detect the power supplied to the heaters 41 to 43. The detected power values are then fed back to the output controller 62 and then the power supplied to the heaters 41 to 43 is controlled so as to approach the predetermined values of the power to be supplied.

Next, the weighted average temperature calculated by the temperature calculator 611 will be described. If a reference temperature is in a temperature range between a first temperature and a second temperature, the temperature calculator 611 is configured to output a weighted average temperature of a temperature measured by the first temperature measurement part (thermocouple 51) and a temperature measured by the second temperature measurement part (pyrometer 52). In this case, the temperature calculator 611 is configured to change a weight of the weighted average temperature such that, as the reference temperature becomes closer to the first temperature, the ratio of the temperature measured by the thermocouple 51 becomes larger, and as the reference temperature becomes closer to the second temperature, the ratio of the temperature measured by the pyrometer 52 becomes larger. The reference temperature, as used herein, is any one of the temperature measured by the thermocouple 51 and the temperature measured by the pyrometer 52.

Meanwhile, the temperature calculator 611 outputs the temperature measured by the thermocouple 51 in a temperature range lower than the first temperature, and outputs the temperature measured by the pyrometer 52 in a temperature range higher than the second temperature. The output from the temperature calculator 611 is transmitted to the output setting part 612 and the main controller 7.

In connection with the weighted average temperature, for example, the temperature calculator 611 is configured to calculate the weighted average temperature T' based on equation (1) below. Equation (1) corresponds to an example in which, when the temperature measured by the thermocouple 51 is used as the reference temperature, the weight of the weighted average temperature is changed linearly according to a change in the reference temperature.

$$T'=\{1-(T_L-T1)/(T2-T1)\}T_L+(T_L-T1)/(T2-T1)T_H \quad (1)$$

wherein $T_L$ is the temperature measured by the thermocouple (first temperature measurement part); $T_H$ is the temperature measured by the pyrometer (second temperature measurement part); $T_1$ is the first temperature; and $T_2$ is the second temperature.

In equation (1), as the reference temperature becomes close to the first temperature $T_1$, the coefficient of $T_L$ increases, and the coefficient of $T_H$ decreases. Accordingly, if the first temperature $T_1$ is substituted as the reference temperature, then $T'=T_L$. In addition, if the reference temperature becomes close to the second temperature $T_2$, the coefficient of $T_L$ decreases, and the coefficient of $T_H$ increases. Accordingly, if the second temperature $T_2$ is substituted as the reference temperature, then $T'=T_H$. As such, in equation (1), the weight of the weighted average temperature changes such that, as the reference temperature becomes closer to the first temperature $T_1$, the ratio of the measured temperature $T_L$ increases, and as the reference temperature becomes closer to the second temperature $T_2$, the ratio of the measured temperature $T_H$ increases.

The main controller 7 is configured by a computer including a CPU and a memory part, and controls each part of the heat treatment apparatus 1. The memory part stores a program including groups of steps (commands) configured to execute operations necessary for heat treatment of the wafer W, such as heating of the stage 3 and adjustment of the internal pressure of the process chamber 11. The program is stored, for example, in a hard disk, a compact disk, a magneto-optical disk, or a memory card, and is installed therefrom to the computer.

In addition, the main controller 7 is configured such that the setting temperature during heat treatment, the output ratios of the first to third heaters 41 to 43, and the like can be input thereto. The setting temperature, as used herein, may be a temperature predetermined for each type of heat treatment, and includes a heat-treatment temperature. In addition, when performing temperature controls including a temperature-raising process in which the temperature is raised to the heat-treatment temperature or a temperature-lowering process in which the temperature is lowered from the heat-treatment temperature, the setting temperature may include the temperature at each timing, or the temperature-raising/temperature-lowering rate. The setting temperature may be transmitted from the main controller 7 to the output setting part 612 and then recorded in a register (not illustrated).

In addition, the main controller 7 is configured to control heating of the first to third heaters 41 to 43 by outputting a control instruction to the heating controller 61 based on the temperature $T_L$ measured by the thermocouple 51 and the temperature $T_H$ measured by the pyrometer 52. That is, if the reference temperature (for example, the temperature $T_L$ measured by the thermocouple 51) is in a temperature range from the first temperature to the second temperature, the main controller 7 is configured to control the output of the respective heaters 41 to 43 based on the weighted average temperature T' calculated by using equation (1) described above. Further, the main controller 7 is configured to control the output of the respective heaters 41 to 43 based on the temperature $T_L$ measured by the thermocouple 51 (first temperature measurement part) in a temperature range in which the reference temperature is lower than the first temperature. On the other hand, the main controller 7 is configured to control the output of the respective heaters 41 to 43 based on the temperature $T_H$ measured by the pyrometer 52 (second temperature measurement part) in a temperature range in which the reference temperature is higher than the second temperature.

FIGS. 5 to 8 schematically illustrate examples of controlling the output of the heating part based on the weighted average temperature T' calculated by using equation (1). In FIGS. 5 to 8, the horizontal axis denotes time, the vertical axis denotes temperature, the solid line denotes a control temperature $T_C$, the one-dot chain line denotes the temperature $T_L$ measured by the thermocouple 51, and the broken line denotes the temperature $T_H$ measured by the pyrometer 52. The control temperature $T_C$, as used herein, refers to a target temperature which is set by the main controller 7 with regard to the output setting part 612 to approach the predetermined setting temperature when controlling the output of the heating part based on the predetermined setting temperature and the measured temperatures $T_L$ and $T_H$.

Figure 5:
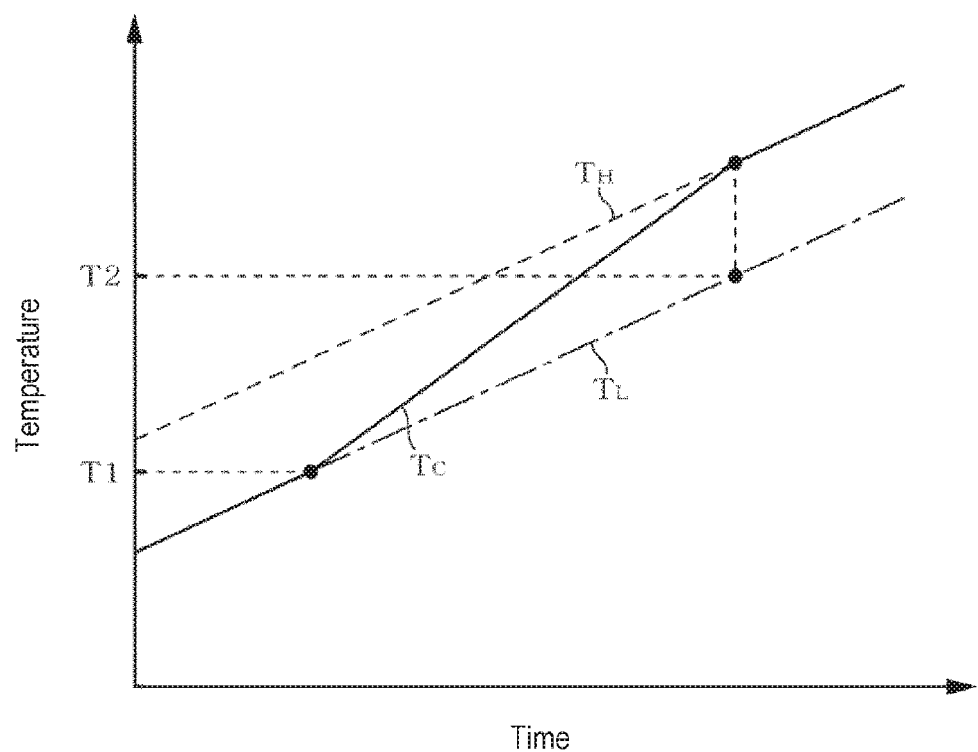
FIG. 5 is a characteristic diagram illustrating an operation of the heat treatment apparatus.

FIG. 5 illustrates an example in which, when the setting temperature is raised linearly over time, the temperature $T_L$ measured by the thermocouple 51 is detected to be lower than the temperature $T_H$ measured by the pyrometer 52. In a temperature range in which the reference temperature (in this case, the temperature $T_L$ measured by the thermocouple 51) is lower than the first temperature $T_1$, the output of the heating part is controlled such that the measured temperature $T_1$ approaches the setting temperature, based on the measured temperature $T_L$. In addition, in a temperature range in which the reference temperature is higher than the second temperature $T_2$, the output of the heating part is controlled such that the measured temperature $T_H$ approaches the setting temperature, based on the measured temperature $T_H$.

If the response of heating by the heater 4 is sufficiently fast, each of the measured temperatures $T_L$ and $T_H$ is almost identical to the control temperature $T_C$. Assuming such an ideal case, FIGS. 5 to 8 schematically illustrate a state in which there is no response delay, and each of the measured temperatures $T_L$ and $T_H$ is identical to the control temperature $T_C$. It is clear from these diagrams that, in a temperature range lower than the first temperature $T_1$, the temperature control is performed based on the temperature $T_L$ measured by the thermocouple 51, and in a temperature range higher than the second temperature $T_2$, the temperature control is performed based on the temperature $T_H$ measured by the pyrometer 52.

On the other hand, if the measured temperature $T_L$ (reference temperature) is in a temperature range from the first temperature $T_1$ to the second temperature $T_2$, the output of the heating part is controlled based on the weighted average temperature T' calculated by using equation (1). As described above, the weight of the weighted average temperature has been adjusted, and the output of the heating part is accordingly controlled while linearly raising the control temperature $T_C$ from the first temperature $T_1$ to the second temperature $T_2$.

Figure 6:
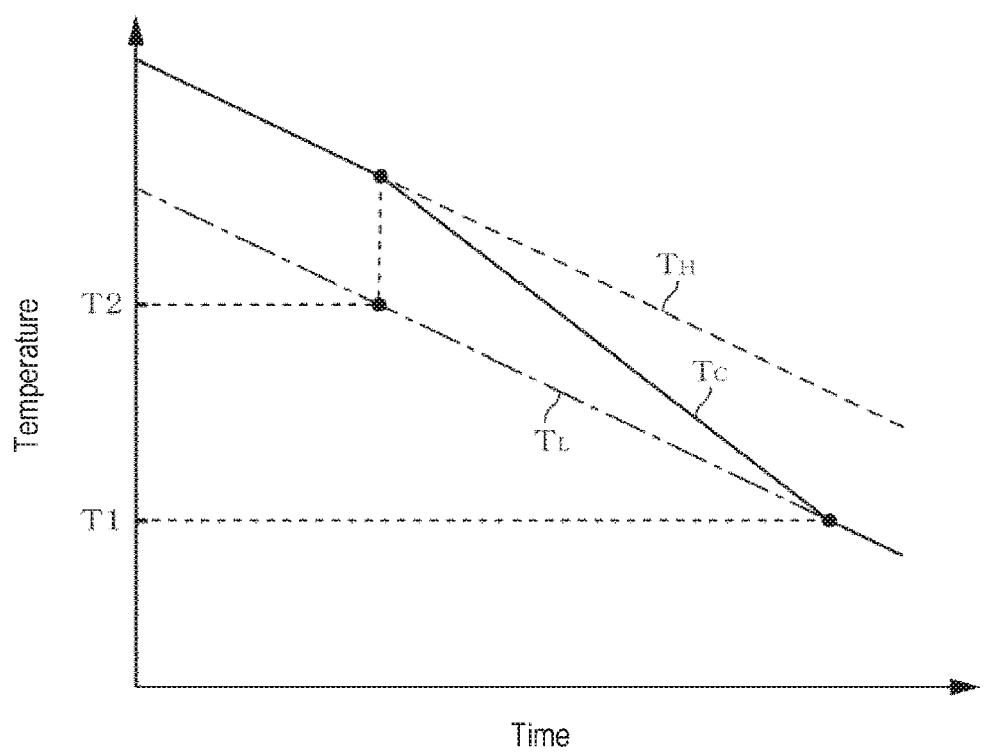
FIG. 6 is a characteristic diagram illustrating an operation of the heat treatment apparatus.
Figure 7:
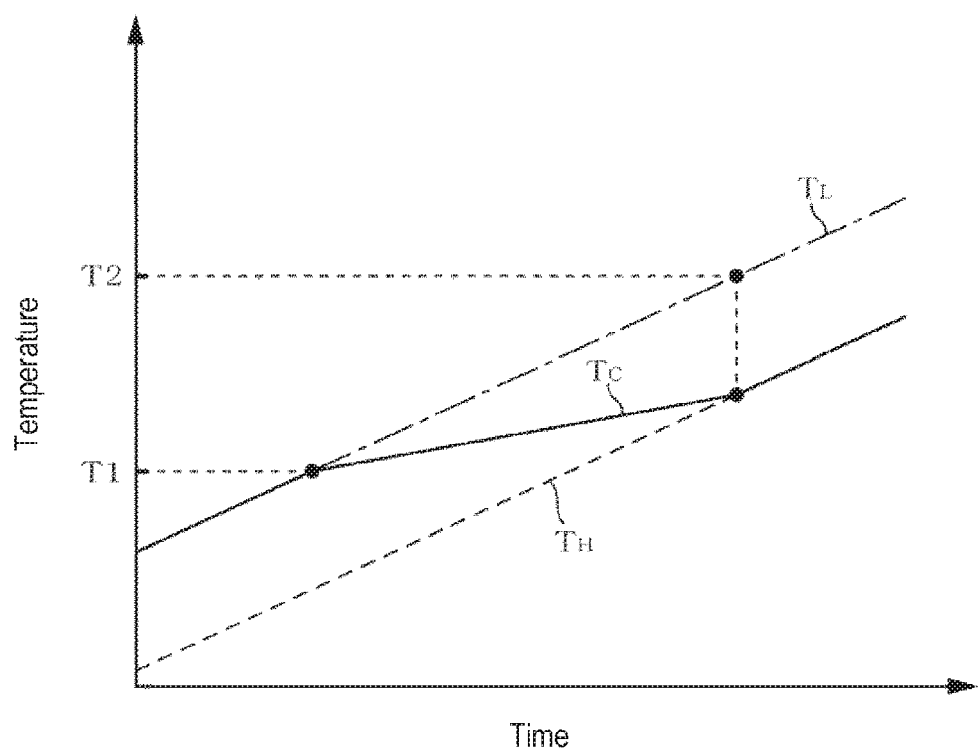
FIG. 7 is a characteristic diagram illustrating an operation of the heat treatment apparatus.
Figure 8:
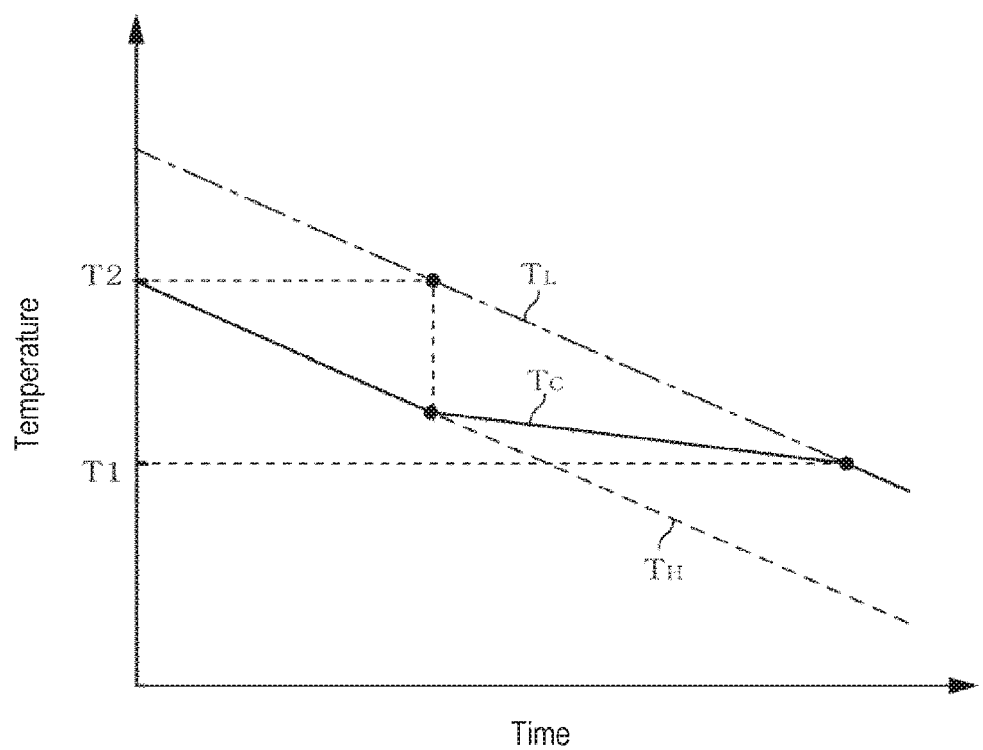
FIG. 8 is a characteristic diagram illustrating an operation of the heat treatment apparatus.

FIG. 6 illustrates an example in which, when the setting temperature is lowered linearly over time, the measured temperature $T_L$ is detected to be lower than the measured temperature $T_H$. FIG. 7 illustrates an example in which, when the setting temperature is raised linearly over time, the measured temperature $T_L$ is detected to be higher than the measured temperature $T_H$. FIG. 8 illustrates an example in which, when the setting temperature is lowered linearly over time, the measured temperature $T_L$ is detected to be higher than the measured temperature $T_H$.

Even in the case of each of these examples, the temperature control is performed based on the temperature $T_H$ measured by the pyrometer 52 in a temperature range in which the reference temperature is higher than the second temperature $T_2$, and based on the temperature $T_L$ measured by the thermocouple 51 in a temperature range in which the reference temperature is lower than the first temperature $T_1$. In addition, the output of the heating part is controlled based on the weighted average temperature T' calculated by using equation (1) in a temperature range in which the reference temperature is in a range from the first temperature $T_1$ to the second temperature $T_2$. As a result, the output of the heating part is controlled while raising/lowering the control temperature $T_C$ linearly between the first temperature $T_1$ and the second temperature $T_2$.

Next, a method for heat-treating a wafer W by the above-described heat treatment apparatus 1 will be described with reference to a case in which the wafer W is modified.

First, the gate valve 113 is opened to load the wafer W, which is a process target, from the loading/unloading port 112 into the process chamber 11 by a transfer arm (not shown) disposed externally, and the wafer W is mounted on the support member 32 by cooperation between the support member 32 and the transfer arm. In this example, loading the wafer W on the support member 32 corresponds to a process of disposing the wafer W on the stage 3. The wafer W, which is the process target, may be obtained by forming a silicon oxide film ($SiO_2$ film) and then forming a SiON film through a nitriding treatment. Thereafter, the gate valve 113 is closed, and vacuum evacuation is performed by the evacuation part 116, thereby adjusting the pressure of the process space 10 inside the process chamber 11 and the internal pressure of the bell jar 2 to a pressure at which the heat treatment is performed.

Meanwhile, the temperature of the stage 3 is gradually raised by the first to third heaters 41 to 43, for example, from a temperature equal to or lower than the first temperature $T_1$ (e.g., room temperature) to a temperature at which the heat treatment is performed (e.g., 700 to 800 degrees C.), based on a predetermined setting temperature. At this time, the thermocouple 51 and the pyrometer 52 measure the temperatures at which the wafer W disposed on the stage 3 is heated, and respective measured temperatures $T_L$ and $T_H$ are output to the temperature calculator 611 of the heating controller 61.

If the temperature $T_L$ measured by the thermocouple 51, which is the reference temperature, is lower than the first temperature $T_1$ (e.g., 300 degrees C.), the temperature calculator 611 outputs the measured temperature $T_L$ to the output setting part 612. The output setting part 612 sets the values of power supplied to the respective heaters 41 to 43 such that the measured temperature $T_L$ approaches the setting temperature. Then, the output controller 62 controls operations of the respective thyristors 431 to 433 of the respective heaters 41 to 43 based on the values of supplied power such that values of power detected at the outlets of respective current transformers 441 to 443 approach the respective values of supplied power.

In addition, if the temperature $T_L$ measured by the thermocouple 51 becomes equal to or higher than the first temperature $T_1$, the temperature calculator 611 outputs the weighted average temperature T' calculated based on equation (1), instead of the temperature $T_L$ measured by the thermocouple 51, to the output setting part 612. The output setting part 612 sets the values of power supplied to the respective heaters 41 to 43 such that the weighted average temperature T' approaches the setting temperature, and controls the output of the respective heaters 41 to 43 via the output controller 62 based on the values of supplied power. The heating control based on the weighted average temperature T' is performed when the temperature $T_L$ measured by the thermocouple 51 is in a temperature range from the first temperature $T_1$ to the second temperature $T_2$. In this example, the second temperature $T_2$ is 350 degrees C.

In addition, if the temperature $T_L$ measured by the thermocouple 51 becomes larger than the second temperature $T_2$, the temperature calculator 611 outputs the temperature $T_H$ measured by the pyrometer 52 to the output setting part 612, instead of the weighted average temperature T'. The output setting part 612 sets the values of power supplied to the respective heaters 41 to 43 such that the measured temperature $T_H$ approaches the setting temperature. The output controller 62 controls the output of the respective heaters 41 to 43 based on the values of supplied power.

In this manner, the output of the heaters 41 to 43 is controlled while sequentially switching the temperature data that are used. If the temperature $T_H$ measured by the pyrometer 52 then reaches the predetermined heat-treatment temperature, the heat treatment of the wafer W is conducted during a predetermined time. The heat treatment of the wafer W proceeds by heat radiation from the stage 3 via an inert gas for heat transfer, which is supplied between the wafer W and the stage 3 from a gas supply port (not shown).

After performing the heat treatment of the wafer W for the predetermined time, the output of the respective heaters 41 to 43 is controlled such that the temperature of the stage 3 is decreased to a temperature that is lower than the first temperature described above, for example, based on a predetermined setting temperature. For example, the output of the heaters 41 to 43 is decreased while supplying the above-mentioned inert gas for heat transfer, thereby lowering the temperature of the stage 3 gradually. The output of the respective heaters 41 to 43 is controlled based on the temperature $T_H$ measured by the pyrometer 52 in a temperature range in which the temperature $T_L$ measured by the thermocouple 51 is higher than the second temperature $T_2$. In addition, the heating control is performed by using the weighted average temperature T' calculated based on the above-described equation (1) if the temperature $T_L$ measured by the thermocouple 51 is in a temperature range between the second temperature $T_2$ and the first temperature $T_1$. Further, in a temperature range in which the temperature $T_L$ measured by the thermocouple 51 is lower than the first temperature $T_1$, the heating control is performed based on the measured temperature $T_L$.

In addition, if the measured temperature $T_L$ decreases to a predetermined temperature, each of the internal pressures of the process chamber 11 and the bell jar 2 is adjusted to the pressure at the time at which the operation of loading the wafer W was performed, and the gate valve 113 is then opened. Thereafter, the transfer arm disposed externally enters the process chamber 11, and the wafer W is unloaded through a path opposite to that of loading the wafer W.

According to this embodiment, when the heat treatment is performed by heating the wafer W disposed on the stage 3 by the heating part, the output of the heating part can be stably controlled. In this example, temperatures are measured by using a first temperature measurement part having a high level of measurement accuracy in a temperature range lower than a first temperature and a second temperature measurement part having a high level of measurement accuracy in a temperature range higher than a second temperature which is higher than the first temperature. However, since the first and second temperature measurement parts have different temperature regions in which a temperature can be measured with a high level of accuracy, a deviation in the temperatures measured by the first and second temperature measurement parts may occur if the first and second temperature measurement parts are switched without taking any action.

It has been recognized that, if a deviation in the measured temperatures occurs as described above when switching the first and second temperature measurement parts, the output of the heating part tends to hunt severely. For example, if the temperature $T_H$ measured by the second temperature measurement part is lower than the temperature $T_L$ measured by the first temperature measurement part, the output of the heating part increases abruptly such that the measured temperature $T_H$ approaches the setting temperature. If the measured temperature $T_H$ increases rapidly accordingly, the output of the heating part abruptly decreases such that the measured temperature $T_H$ approaches the configured temperature, and a large fluctuation of the output of the heating part is repeated until the measured temperature $T_H$ is stabilized. If the hunting of the output of the heating part occurs, it generates repeated thermal stress in the stage 3, thereby resulting in damage or fracture.

Accordingly, in the present disclosure, a transition temperature zone is set in which the temperature measurement part is switched from the first temperature measurement part to the second temperature measurement part, a weighted average value of the first temperature measurement part and the second temperature measurement part is calculated, and the output of the heating part is controlled based on the weighted average temperature. The weighted average temperature has a weight set to change such that, as the reference temperature becomes closer to the first temperature, the ratio of the measured temperature $T_L$ becomes larger, and as the reference temperature becomes closer to the second temperature, the ratio of the measured temperature $T_H$ becomes larger.

Accordingly, the weighted average temperature, which is the control temperature, gradually transitions from the first temperature to the second temperature, thereby suppressing an abrupt change in the control temperature. For this reason, there is little possibility that hunting will occur to the output of the heating part, thereby making it possible to stably control the output of the heating part. In addition, it is possible to suppress occurrence of damage to the stage 3, which results from thermal stress caused by hunting.

Further, if the weight of the weighted average temperature is changed linearly in response to a change in the reference temperature, as in the case of the above-mentioned equation (1), the weighted average temperature changes linearly in a temperature range between the first temperature and the second temperature. As a result, the transition of the control temperature becomes smoother, and the output of the heating part can be controlled in a more stable manner.

Furthermore, in a temperature range lower than the first temperature, the output of the heating part is controlled based on the temperature $T_L$ measured by the first temperature measurement part which has a high degree of measurement accuracy in the temperature range lower than the first temperature. In addition, in a temperature range higher than the second temperature, the output of the heating part is controlled based on the temperature $T_H$ measured by the second temperature measurement part which has a high degree of measurement accuracy in the temperature range higher than the second temperature. As a result, the output of the heating part can be controlled stably from a temperature lower than the first temperature to a temperature higher than the second temperature.

If the thermocouple 51 is used as the first temperature measurement part and a pyrometer 52 is used as the second temperature measurement part, a deviation in the measurement temperature may amount to about 30 degrees C. between the temperatures $T_L$ and $T_H$ measured by the first and second temperature measurement parts. In addition, if the first temperature measurement part (thermocouple 51) and the second temperature measurement part (pyrometer 52) are disposed in different positions, a large deviation is likely to occur between the temperatures measured by the first and second temperature measurement parts. In particular, this tendency become noticeable if one temperature measurement part (thermocouple 51 in this example) is installed outside the stage 3 and the other temperature measurement part (pyrometer 52 in this example) is installed inside the stage 3, as illustrated in FIGS. 1 and 2. However, there are cases where it is necessary to provide two temperature measurement parts in such different positions due to a reason related to the heat treatment apparatus 1, such as a restriction on the equipment layout or a restriction on the wiring of signal lines. Even in such a case, the output of the heating part becomes stable because transition of the control temperature proceeds smoothly, as will be obvious from the result of evaluation (described later), if the control is conducted by using the weighted average temperature according to the present disclosure.

Figure 9:
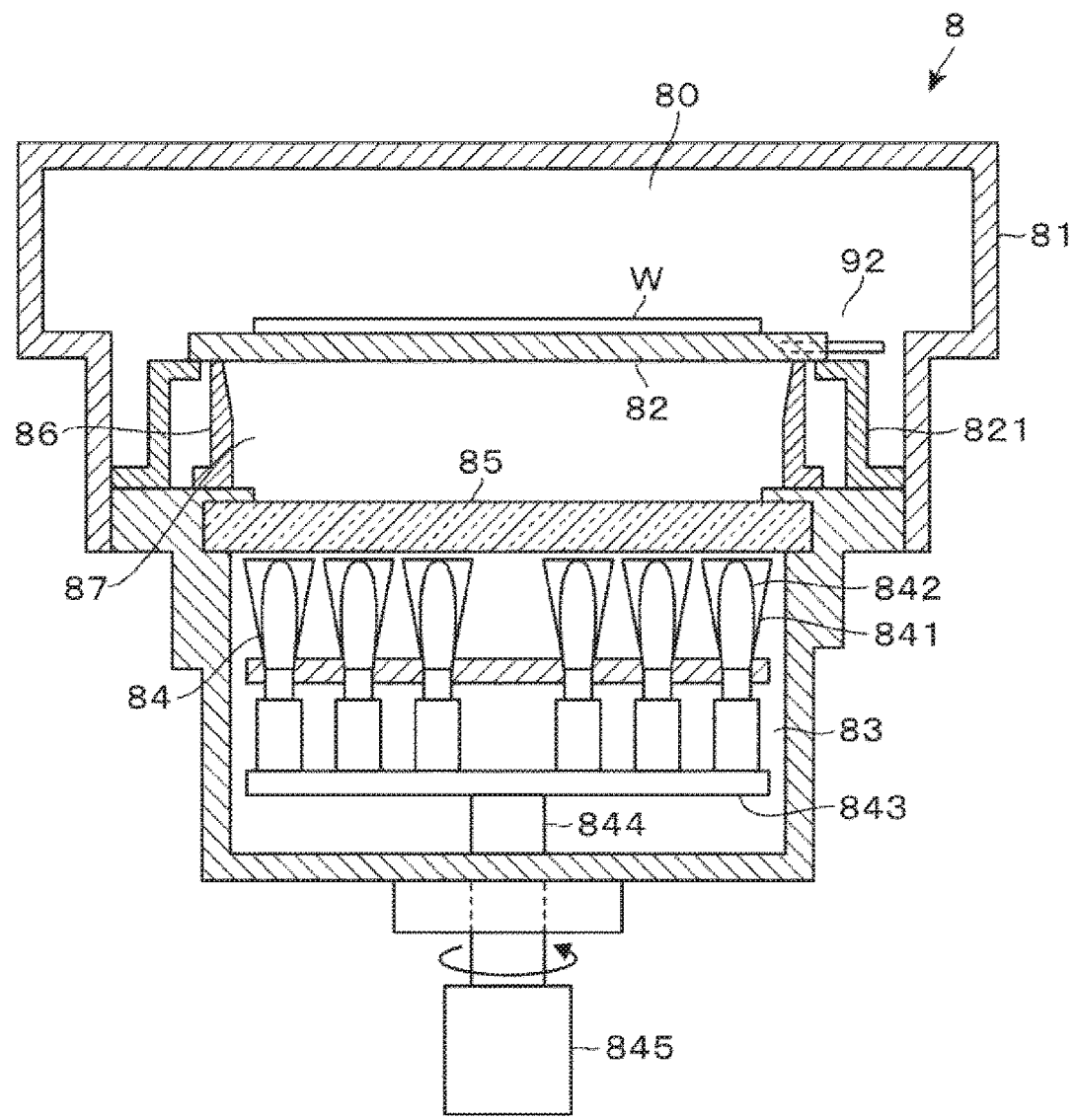
FIG. 9 is a longitudinal cross-sectional side view illustrating a heat treatment apparatus according to another embodiment of the present disclosure.
Figure 10:
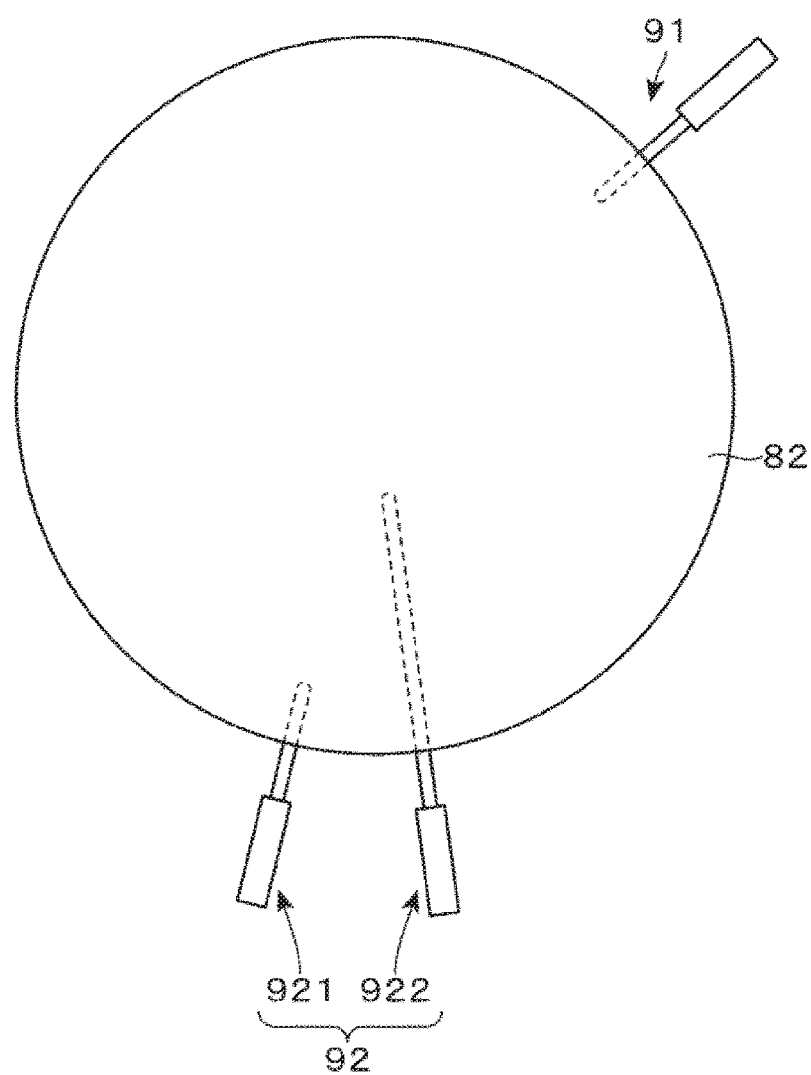
FIG. 10 is a plan view illustrating a part of the heat treatment apparatus according to another embodiment.

Next, a second embodiment of the heat treatment apparatus 8 will be described with reference to FIGS. 9 and 10. The embodiment may employ a heating lamp 84 instead of the carbon wire heater, as the heating part. A stage 82 on which a wafer W is to be disposed is installed inside a process chamber 81 configured to be hermetically sealed, and the stage 82 is supported by a support member 821 installed in the process chamber 81.

A heating chamber 83 is formed below the stage 82 in the process chamber 81, and a plurality of heating lamps 84 are installed in the heating chamber 83. Each heating lamp 84 may include a lamp body 841 configured by, for example, a tungsten lamp or a halogen lamp, and a reflector 842, and is configured to emit light having a predetermined wavelength toward the stage 82.

The heating lamps 84 may be installed on a common rotating plate 843, and may rotate around a vertical axis by means of a rotation mechanism 845, via a rotating shaft 844 installed at the center of the lower surface of the rotating plate 843. A transmission window 85 is formed above the heating lamps 84 so as to transmit light, and an interior of the process chamber 81 is partitioned into the heating chamber 83 and a process space 80 by the transmission window 85. In addition, light that has passed through the transmission window 85 is absorbed into the stage 82, thereby raising the temperature of the stage 82. Reference numeral 86 in FIG. 9 refers to a partition member for forming a heating zone 87 between the stage 82 and the transmission window 85.

Respective terminals of the heating lamps 84 are connected to a power supply part (AC power supply), for example, via thyristors and current transformers, as in the case of the control system illustrated in FIG. 4. In this manner, power supplied to the heating lamps 84 is controlled, for example, by the thyristors and the heating lamps 84 are configured to be able to change the output for heating the wafer W disposed on the stage 82.

In this example, both the first temperature measurement part (thermocouple 91) and the second temperature measurement part (pyrometer 92) are installed inside the stage 82. In addition, the pyrometer 92 includes, as illustrated in FIG. 10, a pyrometer 921 for measuring a temperature of a peripheral edge zone of the stage 82 and a pyrometer 922 for measuring the temperature of a center zone of the stage 82. The thermocouple 91 and the pyrometer 92 (921 and 922) are inserted horizontally from the side wall of the stage 82 toward the center of the stage 82, as illustrated, for example, in FIG. 10. The control system of the heating lamps 84 is configured as described with reference to FIG. 4, and power is supplied from the power supply part to the heating lamps 84 based on temperatures measured by the thermocouple 91 and the pyrometer 92 such that the measured temperatures approach the setting temperature.

Heat treatment performed by the heat treatment apparatus 8 will be described briefly in connection with exemplary film-forming treatment for forming a tungsten (W) film on a wafer W. First, a wafer W is loaded into the process chamber 81 from a loading/unloading port (not illustrated), and is disposed on the stage 82. Then, vacuum evacuation is performed by an evacuation part (not shown) such that the internal pressure of the process chamber 81 is adjusted to a pressure during film-forming treatment.

Furthermore, the stage 82 is heated by the heating lamps 84 such that the temperature thereof gradually rises, for example, from room temperature to a temperature at which a film-forming treatment (heat treatment) is performed (e.g., 300 to 400 degrees C.), based on a predetermined setting temperature. Temperatures are measured by using the thermocouple 91 and the pyrometer 92 such that, in a temperature range in which the temperature $T_L$ measured by the thermocouple 91 (reference temperature) is lower than the first temperature, the output of the heating lamps 84 is controlled based on the temperature $T_L$ measured by the thermocouple 91. In addition, in a temperature range in which the temperature $T_L$ measured by the thermocouple 91 is higher than the second temperature, the output of the heating lamps 84 is controlled based on the temperature $T_H$ measured by the pyrometer 92. In this example, two pyrometers 921 and 922 are used to measure temperatures, and thus the heating control may be performed based on the average value of the respective temperatures measured by the two pyrometers 921 and 922. In addition, the stage 82 may be divided into an inner zone and an outer zone, respectively, and the heating control may be performed differently in respective zones, that is, the inner zone is controlled based on the temperature measured by the pyrometer 922 and the outer zone is controlled based on the temperature measured by the pyrometer 921.

If the temperature $T_L$ measured by the thermocouple 91 is within a temperature range between the first and second temperatures, a weighted average temperature T' is calculated based on the above-mentioned equation (1). In addition, if the reference temperature (measured temperature $T_L$) is within this temperature range, the output of the heating lamps 84 is controlled based on the calculated weighted average temperature T'.

The stage 82 is heated to a predetermined temperature by the heating lamps 84, and a film forming gas (process gas) such as tungsten hexafluoride ($WF_6$) is introduced into the process chamber 81 from a gas supply port (not illustrated). In this manner, a tungsten film is formed on the wafer surface by chemical vapor deposition (CVD). After the tungsten film having a predetermined thickness is formed, the output of the heating lamps 84 is controlled such that the temperature of the stage 82 is lowered, for example, from a predetermined setting temperature to a temperature lower than the first temperature. The control of the output of the heating part in this example is performed in the same manner as in the first embodiment.

According to this embodiment, as in the case of the first embodiment, the output of the heating part can be stably controlled when heating the wafer W disposed on the stage 82 by the heating part so as to heat-treat the same. In this example, both the first and second temperature measurement parts are installed inside the stage 82, and it may thus be said that the deviation between measured temperatures, resulting from a difference in the positions in which they are disposed, is smaller than that in the first embodiment. However, the first and second temperature measurement parts have different temperature regions in which a temperature is measured with a high level of accuracy. Accordingly, when switching the first and second temperature measurement parts, providing a transition temperature zone and performing a control using a weighted average temperature are effective in stabilizing the output of the heating part.

In the above description, a relation between the first and second temperature measurement parts may be established such that the first temperature measurement part has a high level of measurement accuracy in a low temperature region, and the second temperature measurement part has a high level of measurement accuracy in a high temperature region. This relation, if satisfied, makes it possible to use temperature measurement parts other than the thermocouple and the pyrometer, as the first and second temperature measurement parts. In addition, the first and second temperature measurement parts may be configured by using temperature measurement parts, which have the same measurement scheme but have a high level of measurement accuracy in different temperature regions. For example, the first and second temperature measurement parts may be configured by using pyrometers having different temperature measurement ranges.

If a relation between the first and second temperature measurement parts is established such that the first temperature measurement part has a high level of measurement accuracy in a low temperature region, and the second temperature measurement part has a high level of measurement accuracy in a high temperature region, then first and second temperatures may be configured as follows.

The first temperature is not limited to a temperature Ta at which a deviation starts to occur between the temperature $T_L$ measured by the first temperature measurement part and the actual temperature, but may be configured as a temperature lower than the temperature Ta or a temperature higher than the temperature Ta, if the first temperature is within an allowable range. In addition, the second temperature is not limited to a temperature $T_b$ at which a deviation starts to be eliminated between the temperature $T_H$ measured by the second temperature measurement part and the actual temperature, but may be configured as a temperature lower than the temperature $T_b$ or a temperature higher than the temperature $T_b$, if the second temperature is within an allowable range.

If the first temperature is set as the temperature Ta, the heating control using the weighted average temperature T' starts at a time at which the measured temperature $T_L$ begins to deviate from the actual temperature. In addition, if the first temperature is set as a temperature lower than the temperature Ta, the heating control using the weighted average temperature T' starts even in a state in which a deviation between the measured temperature $T_L$ and the actual temperature does not occur. On the other hand, even if the first temperature is configured as a temperature higher than the temperature Ta, the control of the output of the heating part is stabilized, compared with the case in which the control using the weighted average temperature $T_C$ is not performed, as long as, for example, the deviation of the measured temperature is within an allowable range that does not cause the above-mentioned hunting.

If the second temperature is set as the temperature $T_b$, the heating control using the weighted average temperature T' is performed until a time at which the measured temperature $T_H$ becomes identical to the actual temperature. In addition, if the second temperature is set as a temperature higher than the temperature $T_b$, there is a time zone in which the heating control using the weighted average temperature T' is performed, even if the deviation between the measured temperature $T_L$ and the actual temperature is eliminated. On the other hand, if the second temperature is set as a temperature lower than the temperature $T_b$, the control using the weighted average temperature will be terminated when there is a deviation between the measured temperature $T_H$ and the actual temperature. It is to be noted, in this case as well, that, if the deviation of the measured temperature is within an allowable range, the control of the output of the heating part can be stabilized, compared with the case in which the control using the weighted average temperature T' is not performed.

It has been assumed in each of the examples described above that the temperature $T_L$ measured by the first temperature measurement part is used as the reference temperature. On the other hand, it is also possible to use the temperature $T_H$ measured by the second temperature measurement part as the reference temperature. In this case, the temperature calculator is configured, for example, to calculate the weighted average temperature T' based on equation (2) below. Equation (2) corresponds to an example in which, when the temperature $T_H$ measured by the second temperature measurement part is used as a reference temperature, the weight of the weighted average temperature is changed linearly according to a change in the reference temperature. In this case as well, the weight of the weighted average temperature is changed such that, as the reference temperature becomes closer to the first temperature $T_1$, the ratio of the measured temperature $T_L$ increases, and as the reference temperature becomes closer to the second temperature $T_2$, the ratio of the measured temperature $T_H$ increases.

$$T'=\{1-(T_H-T1)/(T2-T1)\}T_L+(T_H-T1)(T2-T1)T_H \quad (2)$$

Even if the temperature $T_H$ measured by the second temperature measurement part is used as the reference temperature, the output of the heating part is controlled based on the temperature $T_L$ measured by the first temperature measurement part in a temperature range in which the measured temperature $T_H$ (reference temperature) is lower than the first temperature $T_1$. In addition, if the measured temperature $T_H$ (reference temperature) is in a temperature range between the first temperature $T_1$ and the second temperature $T_2$, the output of the heating part is controlled based on the weighted average temperature T' calculated based on equation (2). Moreover, in a temperature range in which the measured temperature $T_H$ (reference temperature) is higher than the second temperature $T_2$, the output of the heating part is controlled based on the temperature $T_H$ measured by the second temperature measurement part.

As such, if the temperature $T_H$ measured by the second temperature measurement part reaches the first temperature $T_1$, the control is performed based on the calculated weighted average temperature T'. Accordingly, for example, if the temperature $T_L$ measured by the first temperature measurement part is detected to be lower than the temperature $T_H$ measured by the second temperature measurement part as illustrated in FIG. 5, the measured temperature $T_H$ reaches the first temperature $T_1$ before the temperature $T_L$ reaches the first temperature $T_1$, and the control based on the weighted average temperature T' is started. In addition, if the temperature $T_L$ measured by the first temperature measurement part is detected to be higher than the temperature $T_H$ measured by the second temperature measurement part as illustrated in FIG. 7, the measured temperature $T_H$ does not reach the first temperature $T_1$ even if the measured temperature $T_L$ has reached the first temperature $T_1$, and the start of the control based on the weighted average temperature T' is delayed.

Accordingly, if the heating control during a temperature rise is performed by using the temperature $T_H$ measured by the second temperature measurement part as the reference temperature, the temperature range in which the heating is controlled may be modified by using the weighted average temperature such that the control can be started based on the weighted average temperature at the same timing as when the temperature $T_L$ measured by the first temperature measurement part is used as the reference temperature. In the examples described above with reference to FIGS. 5 and 7, cases in which the values set for the first and second temperatures are lowered may be illustrated.

In the above-described example, the temperature calculator is configured to change the weight of the weighted average temperature linearly according to a change in the reference temperature, but the weighted average temperature is not limited to calculations by equation (1) or equation (2). For example, the weighted average temperature may also be configured such that the weight is changed non-linearly along a curve or the like.

In addition, in the temperature range from the first temperature to the second temperature, the control of the output of the heating part based on the weighted average temperature may be performed when the substrate is heated for the heat treatment, at least during the time the temperature rises.

Moreover, if the control of the output of the heating part based on the weighted average temperature is performed both during a temperature rise and during a temperature fall in the heat treatment, one of the temperature measured by the first temperature measurement part and the temperature measured by the second temperature measurement part, which may become a reference temperature, may be used as a reference temperature during the temperature rise, and the other temperature may be used as a reference temperature during the temperature fall.

Examples

Figure 11:
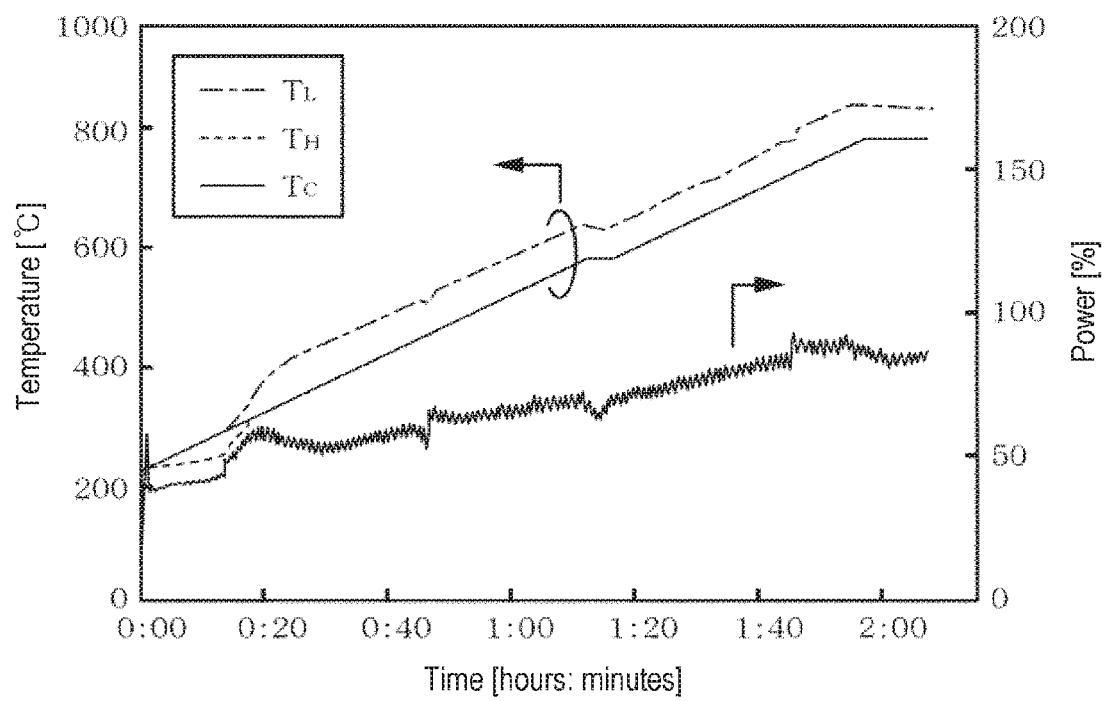
FIG. 11 is a characteristic diagram illustrating a result of an evaluation test of the heat treatment apparatus according to the present disclosure.
Figure 12:
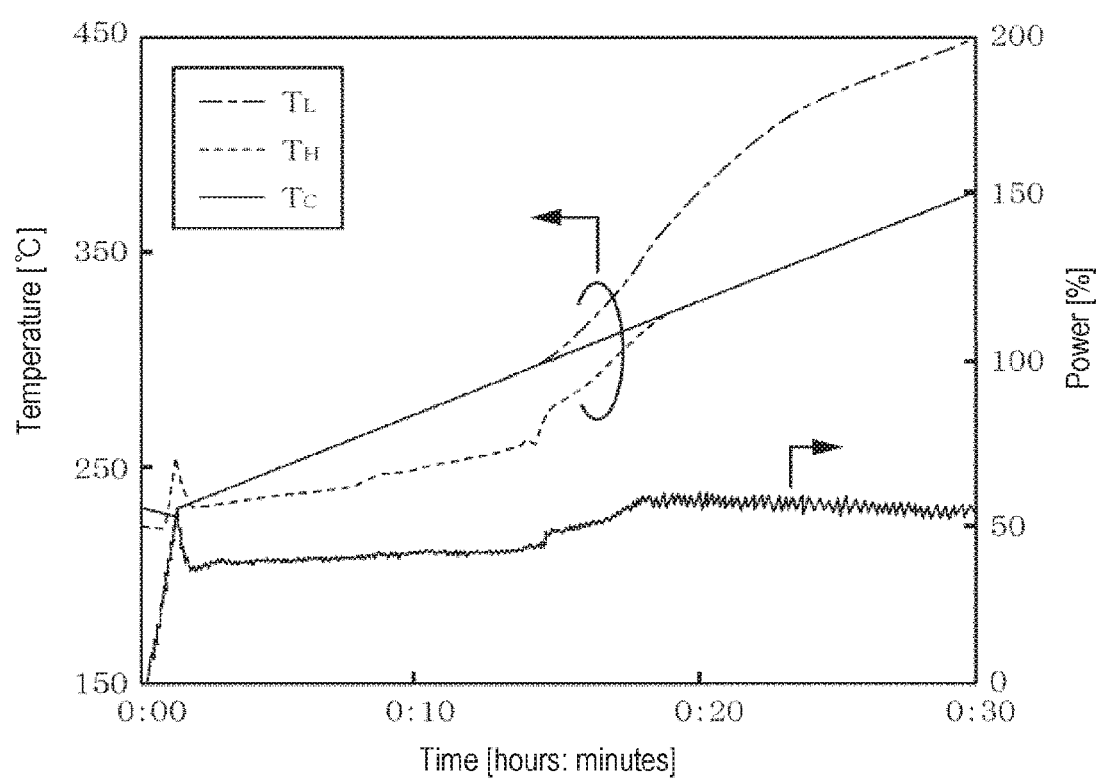
FIG. 12 is a characteristic diagram illustrating a result of an evaluation test of the heat treatment apparatus according to the present disclosure.

Next, a result of evaluation will be described with reference to FIGS. 11 and 12 in a case in which the output of the heating part is controlled using the heat treatment apparatus 1 illustrated in FIGS. 1 and 2 based on the weighted average temperature. In FIGS. 11 and 12, the horizontal axis denotes time, the left vertical axis denotes temperature, and the right vertical axis denotes output power of the heating part. In addition, in FIGS. 11 and 12, the one-dot chain line denotes the temperature $T_L$ measured by the thermocouple 51 (first temperature measurement part), the broken line denotes the temperature $T_H$ measured by the pyrometer 52 (second temperature measurement part), and the solid line denotes a control temperature $T_C$. FIG. 12 is an enlarged view of the measured temperatures $T_L$ and $T_H$, the control temperature $T_C$, and the output of the heating part from the start of measurement to 30 minutes therefrom. The first temperature $T_1$ is set to 300 degrees C., the second temperature $T_2$ is set to 350 degrees C., and the heating control of the first to third heaters 41 to 43 are performed in the same manner as in the first embodiment.

It is clear from the result illustrated in FIGS. 11 and 12 that the temperature $T_L$ measured by the thermocouple 51 is identical to the control temperature $T_C$ from about 220 degrees C. (measurement start temperature) to about 300 degrees C. and the output of the heater 4 is controlled based on the measured temperature $T_L$. On the other hand, at a temperature higher than 300 degrees C., at which the control based on the weighted average temperature begins, the deviation between the temperature $T_L$ measured by the thermocouple 51 and the control temperature $T_C$ increases gradually. In addition, the temperature $T_H$ measured by the pyrometer 52 is identical to the control temperature $T_C$ at a temperature higher than about 320 degrees C. The reason that the measured temperature $T_H$ is identical to the control temperature $T_C$ at a temperature higher than 320 degrees C. is because the measured temperature $T_L$ (reference temperature) has reached 350 degrees C., the weight of the temperature $T_L$ in equation (1) accordingly becomes "0", and the weight of the measured temperature $T_H$ becomes "1".

Further, it is clear that at 350 degrees C. or higher, the output of the heater 4 is controlled based on the measured temperature $T_H$. On the other hand, it is recognized that at a temperature lower than 320 degrees C. the deviation from the control temperature $T_C$ increases. It is also recognized that, in the transition temperature zone during switching of the thermocouple 51 and the pyrometer 52, the control temperature $T_C$ rises linearly from 300 degrees C. to 350 degrees C. It was also confirmed that the control temperature $T_C$ rises linearly from 220 degrees C. to 800 degrees C. over time, and the control of the output of the heating part is stabilized without undergoing hunting.

Figure 13:
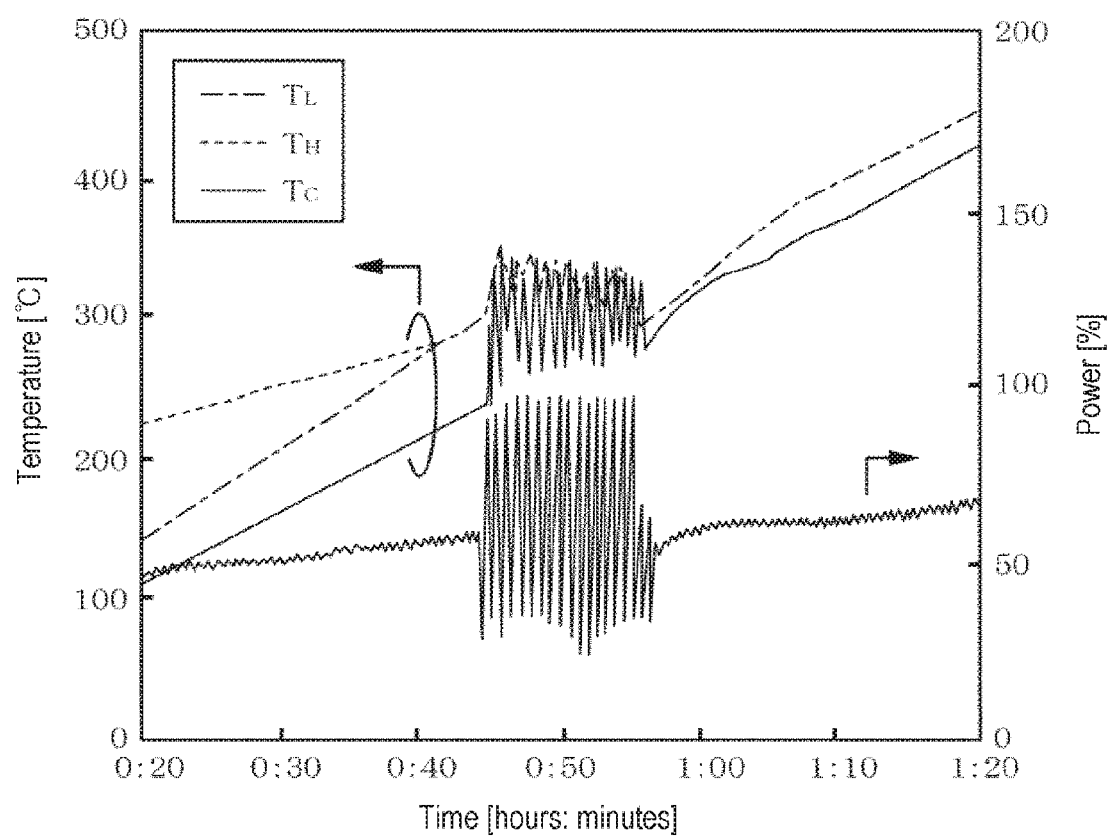
FIG. 13 is a characteristic diagram illustrating a result of an evaluation test of a heat treatment apparatus of a comparative example.

FIG. 13 illustrates a result of evaluation of a comparative example. In this comparative example, the heat treatment apparatus 1 illustrated in FIGS. 1 and 2 is used, and the temperature measurement part is switched from the thermocouple 51 to the pyrometer 52 at a temperature near 300 degrees C., without controlling the output of the heating part based on the weighted average temperature. In FIG. 13, the horizontal axis denotes time, the left vertical axis denotes temperature, the right vertical axis denotes output power of the heating part, the one-dot chain line denotes the temperature $T_L$ measured by the thermocouple 51, the broken line denotes the temperature $T_H$ measured by the pyrometer 52, and the solid line denotes a control temperature $T_C$.

From the result illustrated in FIG. 13, it is recognized that, during switching from the thermocouple 51 to the pyrometer 52, severe hunting occurs to the control temperature $T_C$ (that is, temperature $T_H$ measured by the pyrometer 52) and the output of the heating part. This hunting results from the deviation between the temperature $T_L$ measured by the thermocouple 51 and the temperature $T_H$ measured by the pyrometer 52, as described above. In this example, during switching from the thermocouple 51 to the pyrometer 52, the temperature $T_L$ measured by the thermocouple 51 is multiplied by a correction coefficient, thereby reducing the deviation between the measured temperatures $T_L$ and $T_H$. However, since there actually exists a deviation between the measured temperatures $T_L$ and $T_H$, the control temperature $T_C$ varies greatly in order to remove the deviation, and the output of the heating part accordingly increases or decreases greatly. In this example, hunting continues for about 10 minutes until the temperature $T_H$ measured by the pyrometer 52 becomes stable. If such hunting occurs each time heat treatment is performed, there is a possibility that damage to the stage 3 will accumulate and leave the stage 3 damaged or fractured.

The apparatus for heat-treating a substrate according to the present disclosure is not limited to the apparatus according to the first and second embodiments, and the configuration of the heating part may be configured appropriately. In addition, the heat treatment performed on a substrate includes not only film-forming treatment and modifying treatment, but also etching treatment and the like. Further, the substrate to which the present disclosure is applicable is not limited to a semiconductor wafer W. For example, the substrate may be a glass substrate of a flat panel display (FPD).

According to the present disclosure in some embodiments, it is possible to stably control an output of a heating part when performing a heat-treatment on a substrate by heating and using the heating part.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for heat-treating a substrate, the apparatus comprising:
   a stage on which the substrate is disposed;
   a heating part configured to change an output for heating the substrate disposed on the substrate;
   a first temperature measurement part configured to measure a temperature at which the substrate is heated by the heating part;
   a second temperature measurement part configured to measure the temperature at which the substrate is heated by the heating part, and having a level of measurement accuracy that is lower than a level of measurement accuracy of the first temperature measurement part in a first temperature region lower than a first temperature and is higher than the level of measurement accuracy of the first temperature measurement part in a second temperature region higher than a second temperature which is higher than the first temperature;

a temperature calculator configured to calculate a weighted average temperature of the temperature measured by the first temperature measurement part and the temperature measured by the second temperature measurement part if a reference temperature, which is one of the temperature measured by the first temperature measurement part and the temperature measured by the second temperature measurement part, is in a temperature range between the first temperature and the second temperature, and configured to change a weight of the weighted average temperature such that a ratio of the temperature measured by the first temperature measurement part becomes larger as the reference temperature becomes closer to the first temperature, and a ratio of the temperature measured by the second temperature measurement part becomes larger as the reference temperature becomes closer to the second temperature; and a controller configured to control the output of the heating part based on the weighted average temperature calculated by the temperature calculator in the temperature range between the first temperature and the second temperature.

2. The apparatus of claim 1, wherein the temperature calculator is further configured to change the weight linearly according to a change in the reference temperature.

3. The apparatus of claim 2, wherein the controller is further configured to control the output of the heating part based on the temperature measured by the first temperature measurement part in a temperature range in which the reference temperature is lower than the first temperature and to control the output of the heating part based on the temperature measured by the second temperature measurement part in a temperature range in which the reference temperature is higher than the second temperature.

4. The apparatus of claim 3, wherein the first temperature measurement part is configured to measure the temperature by a thermocouple, and the second temperature measurement part is configured to measure the temperature based on a result of sensing heat radiation.

5. The apparatus of claim 4, wherein the first temperature is 300 degrees C. and the second temperature is 350 degrees C.

6. The apparatus of claim 5, wherein the first temperature measurement part and the second temperature measurement part are disposed in different positions.

7. The apparatus of claim 6, wherein one of the first temperature measurement part and the second temperature measurement part is disposed outside the stage, and the other one of the first temperature measurement part and the second temperature measurement part is disposed inside the stage.

8. The apparatus of claim 1, wherein the controller is further configured to control the output of the heating part based on the temperature measured by the first temperature measurement part in a temperature range in which the reference temperature is lower than the first temperature and to control the output of the heating part based on the temperature measured by the second temperature measurement part in a temperature range in which the reference temperature is higher than the second temperature.

9. The apparatus of claim 1, wherein the first temperature measurement part is configured to measure the temperature by a thermocouple, and the second temperature measurement part is configured to measure the temperature based on a result of sensing heat radiation.

10. The apparatus of claim 1, wherein the first temperature measurement part and the second temperature measurement part are disposed in different positions.

11. A method for heat-treating a substrate, the method comprising:

disposing the substrate on a stage;

measuring a temperature at which the substrate disposed on the stage is heated, by a first temperature measurement part;

measuring the temperature at which the substrate disposed on the stage is heated, by a second temperature measurement part having a level of measurement accuracy that is lower than a level of measurement accuracy of the first temperature measurement part in a first temperature region lower than a first temperature and is higher than the level of measurement accuracy of the first temperature measurement part in a second temperature region higher than a second temperature which is higher than the first temperature;

calculating a weighted average temperature of the temperature measured by the first temperature measurement part and the temperature measured by the second temperature measurement part, if a reference temperature, which is one of the temperature measured by the first temperature measurement part and the temperature measured by the second temperature measurement part, is in a temperature range between the first temperature and the second temperature;

changing a weight of the weighted average temperature such that, a ratio of the temperature measured by the first temperature measurement part becomes larger as the reference temperature becomes closer to the first temperature, and a ratio of the temperature measured by the second temperature measurement part becomes larger as the reference temperature becomes closer to the second temperature, in the calculating of the weighted average temperature; and changing an output of a heating part configured to heat the substrate, based on the weighted average temperature in the temperature range between the first temperature and the second temperature.

12. The method of claim 11, wherein the changing the weight of the weighted average temperature comprises changing the weight linearly according to a change in the reference temperature.

13. The method of claim 12, further comprising:

controlling the output of the heating part based on the temperature measured by the first temperature measurement part in a temperature range in which the reference temperature is lower than the first temperature; and controlling the output of the heating part based on the temperature measured by the second temperature measurement part in a temperature range in which the reference temperature is higher than the second temperature.

14. The method of claim 13, wherein the first temperature measurement part is configured to measure the temperature by using a thermocouple, and the second temperature measurement part is configured to measure the temperature based on a result of sensing heat radiation.

15. The method of claim 14, wherein the first temperature is 300 degrees C. and the second temperature is 350 degrees C.

16. The method of claim 15, wherein the first temperature measurement part and the second temperature measurement part are disposed in different positions.

17. The method of claim 16, wherein one of the first temperature measurement part and the second temperature measurement part is disposed outside the stage, and the other one of the first temperature measurement part and the second temperature measurement part is disposed inside the stage.

18. The method of claim 11, further comprising:
controlling the output of the heating part based on the temperature measured by the first temperature measurement part in a temperature range in which the reference temperature is lower than the first temperature; and
controlling the output of the heating part based on the temperature measured by the second temperature measurement part in a temperature range in which the reference temperature is higher than the second temperature.

19. The method of claim 11, wherein the first temperature measurement part is configured to measure the temperature by using a thermocouple, and the second temperature measurement part is configured to measure the temperature based on a result of sensing heat radiation.

20. The method of claim 11, wherein the first temperature measurement part and the second temperature measurement part are disposed in different positions.

* * * * *